United States Patent
Park

(10) Patent No.: US 8,102,159 B2
(45) Date of Patent: Jan. 24, 2012

(54) POWER DISTRIBUTOR AND SEMICONDUCTOR DEVICE HAVING THE SAME

(75) Inventor: Kun-Woo Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 341 days.

(21) Appl. No.: 12/429,483

(22) Filed: Apr. 24, 2009

(65) Prior Publication Data

US 2010/0164464 A1    Jul. 1, 2010

(30) Foreign Application Priority Data

Dec. 26, 2008    (KR) .................. 10-2008-0134895

(51) Int. Cl.
*H02J 7/00* (2006.01)
(52) U.S. Cl. .......................................... 320/166; 326/33

(58) Field of Classification Search .................. None
See application file for complete search history.

(56) References Cited

U.S. PATENT DOCUMENTS 7,629,833 B2 * 12/2009 Kim et al. .................. 327/538
7,719,310 B2 *  5/2010 Yokoi et al. .................. 326/33

FOREIGN PATENT DOCUMENTS

KR    10-2002-0002883 A    1/2002
KR    10-2005-0086688 A    8/2005

OTHER PUBLICATIONS

Notice of Preliminary Rejection issued from Korean Intellectual Property Office on Mar. 25, 2010.

* cited by examiner

*Primary Examiner* — Minh N Tang
(74) *Attorney, Agent, or Firm* — IP & T Group LLP

(57) ABSTRACT

A power distributor includes a large reservoir capacitor, a switch coupled between at least one power supply line and the large reservoir capacitor, and a controller configured to turn on or off the switch based on whether a circuit block connected to the power supply line is in operation or not.

28 Claims, 4 Drawing Sheets

POWER DISTRIBUTOR AND SEMICONDUCTOR DEVICE HAVING THE SAME

CROSS-REFERENCE TO RELATED APPLICATIONS

The present invention claims priority of Korean patent application number 10-2008-0134895, filed on Dec. 26, 2008, the disclosure of which is incorporated by reference herein in its entirety.

BACKGROUND OF THE INVENTION

The present invention relates to a power distributor and a memory device having the same. The power distributor in accordance with an embodiment of the present invention can be applied to other semiconductor integrated circuits.

Lately, a typical semiconductor device including a dynamic random access memory (DRAM) has been required to operate with a low voltage and at a high speed. If a memory is driven with a low voltage at a high speed, the memory may have the following unintended consequences. That is, when the memory operates at a high speed, small inductance of a package or a board may disturb supplying necessary power. If a memory is driven with a low supply voltage in order to reduce power consumption thereof, the noise of a low power supply voltage may change circuit delay, and cause the memory to erroneously operate.

In order to overcome such consequences, a reduction in the noise of low power supply voltage is desired. That is, impendence between an external power supply and an on-chip circuit is desired to be controlled to be small. For example, the impedance may be reduced by increasing the capacitance of a reservoir capacitor at a peripheral circuit in a chip. Here, the reservoir capacitor may be used in a power distributor to minimize a voltage drop due to power consumption.

Although it is possible to obtain small impedance by using a reservoir capacitor having a small equivalent series resistance (ESR) with respect to radio frequency noise, a reservoir capacitor having very high capacitance may be required for compensating low frequency noise.

Meanwhile, the capacitance of a reservoir capacitor is in proportion to a surface area of an electrode and in inverse proportion to a thickness of a dielectric. Therefore, a thickness of a dielectric must be thin to obtain large capacitance in a given area. However, leakage current of the reservoir capacitor becomes a significant problem if the dielectric is thin.

SUMMARY OF THE INVENTION

Exemplary embodiments of the present invention are directed to providing a power distributor for preventing leakage current of a large reservoir capacitor from increasing.

Exemplary embodiments of the present invention are directed to providing an integrated circuit having the power distributor.

Exemplary embodiments of the present invention are directed to providing a memory device having the power distributor.

In accordance with an exemplary aspect of the present invention, there is provided a power distributor including a large reservoir capacitor, a switching unit connected between at least one power supply line and the large reservoir capacitor, and a controller which turns on or off the switching unit based on an operation state of a circuit block coupled to the power supply line.

In accordance with another exemplary aspect of the present invention, there is provided an integrated circuit including a large reservoir capacitor, a circuit block configured to be driven with a power supply voltage from at least one power supply line, and a switching unit configured to receive information about whether the circuit block is enabled or disabled and to control an electrical connection between the large reservoir capacitor and the power supply line in response to the received information.

The integrated circuit may further include a sensor configured to determine whether the circuit block is enabled or not and to turn on or off the switching unit. The integrated circuit may further include a controller configured to control the circuit block and the switching unit.

The circuit block may be a block that generates a low frequency noise when the circuit block is enabled. The large reservoir capacitor may have leakage current and the circuit block consumes power at least 100 times greater than power consumed by the leakage current when the circuit block is enabled.

In accordance with still another exemplary aspect of the present invention, there is provided a memory device including a large reservoir capacitor, a switching unit configured to control an electrical connection between the large reservoir capacitor and at least one power supply line, and a controller configured to receive external instruction commands and to turn on or off the switching unit based on an operation mode of the semiconductor device.

The large reservoir capacitor may have leakage current, and the switching unit may be turned on at an operation mode that consumes power at least 100 times greater than power consumed by the leakage current. The switching unit may be turned off at one of a power-down mode, a stand-by mode, and a refresh mode.

The power supply line may include a first power supply line and a second power supply line, and the switching unit may be disposed between the large reservoir capacitor and at least one of the first power supply line and the second power supply line.

The large reservoir capacitor may include a first capacitor group having a plurality of capacitors coupled in parallel, and a second capacitor group having a plurality of capacitors coupled in parallel. The first capacitor group may be coupled to the second capacitor group in series. The first capacitor group may be coupled to the second capacitor group in series.

The capacitor may be a stack capacitor formed by sequentially stacking a lower electrode conductive layer, a dielectric layer, and an upper electrode conductive layer. The large reservoir capacitor has a μF level capacitance.

DESCRIPTION OF SPECIFIC EMBODIMENTS

Other objects and advantages of the present invention can be understood by the following description, and become apparent with reference to the embodiments of the present invention.

Figure 1:
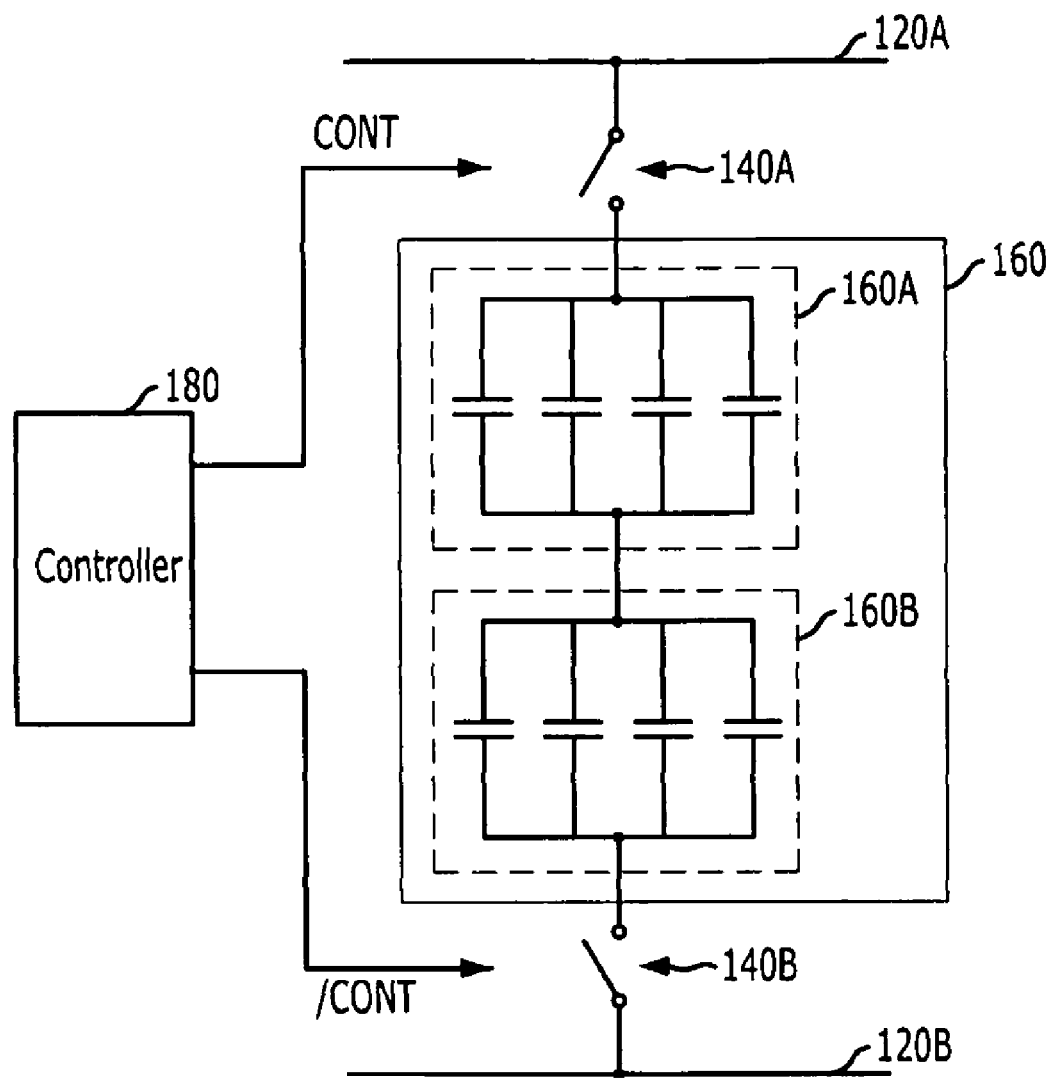
FIG. 1 is a diagram illustrating a power distributor in accordance with an embodiment of the present invention.

FIG. 1 is a diagram illustrating a power distributor in accordance with an embodiment of the present invention.

Referring to FIG. 1, the power distributor in accordance with an embodiment of the preset invention includes a large reservoir capacitor 160, a first switching unit 140A, a second switching unit 140B and a controller 180.

The power supply line includes a first power supply line 120A having a power supply voltage VDD and a second power supply line 120B having a ground voltage VSS.

The first switching unit 140A is coupled between the first power supply line 120A and the large reservoir capacitor 160. The second switching unit 140B is coupled between the second power supply line 120B and the large reservoir capacitor 160. A typical MOS transistor switch is used as the first and second switching units 140A and 140B. Although the power distributor in accordance with an embodiment of the present invention includes the first and second switching units 140A and 140B, the present invention is not limited thereto. For example, the power distributor in accordance with an embodiment may include only one of the first and second switching units.

The large reservoir capacitor 160 includes a first capacitor group 160A and a second capacitor group 160B. The first capacitor group 160A includes a plurality of capacitors coupled in parallel, and the second capacitor group 160B includes a plurality of capacitors coupled in parallel. The first capacitor group 160A is coupled to the second capacitor group 160B in series.

A unit capacitor of the reservoir capacitor 160 may be a stack capacitor formed by sequentially stacking a lower electrode conductive layer, a dielectric layer, and an upper electrode conductive layer. The dielectric is thin to have large capacity such as a μF level capacity.

The controller 180 turns on or off the first and second switching units 140A and 140B according to whether a predetermined circuit block (not shown) coupled to the power supply lines 120A and 120B is in operation or not.

The controller 180 determines logical values of control signals CONT and/CONT based on an operation state of a circuit block (not shown) to which a power supply voltage is supplied through the power supply lines 120A and 120B. For example, if a circuit block generates a low frequency noise when it is enabled or if a circuit block consumes power at least 100 times greater than that consumed by a leakage current of the large reservoir capacitor, the controller 180 turns on the first and second switching units 140A and 140B when the circuit block is enabled. If not, the controller 180 turns off the first and second switching units 140A and 140B.

It is possible to obtain small enough impedance using a reservoir capacitor having a small equivalent series resistance (ESR) for radio frequency noise. However, a reservoir capacitor having very large capacitance is required for the low frequency noise. Meanwhile, in order to embody a reservoir capacitor to have a large capacity within a limited area, a stack capacitor having a thin dielectric must be used. However, such a large reservoir capacitor 160 having a thin dielectric may have large leakage current.

If a circuit block supplied with power from the power supply lines 120A and 120B is a block generating low frequency noise, a low frequency noise can be removed by electrically connecting the large reservoir capacitor 160 to the power supply line when the circuit block is enabled. On the contrary, when the circuit block is disabled, the large reservoir capacitor 160 may be disconnected from the power supply line to reduce leakage current.

If a circuit block consumes power at least 100 times greater than leakage current of the reservoir capacitor when the circuit block is enabled, the reservoir capacitor 160 may be electrically connected to the power supply line because the leakage current of the reservoir capacitor is a minimal value that can be ignored. However, when the circuit block is disabled, the leakage current of the reservoir capacitor is significant in power consumption of an overall system. Therefore, the reservoir capacitor is electrically disconnected from the power supply lines. For example, if a circuit block is disabled for relatively long time, the leakage current that steadily flows through the reservoir capacitor becomes significant.

The power distributor according to the present embodiment can prevent the leakage current of the reservoir capacitor by controlling an electric connection between the power supply lines 120A and 120B and the reservoir capacitor 160 based on the operation state.

Figure 2A:
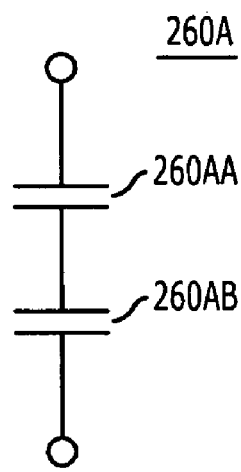
FIGS. 2A and 2B are circuit diagrams illustrating large reservoir capacitors in accordance with another embodiment of the present invention.
Figure 2B:
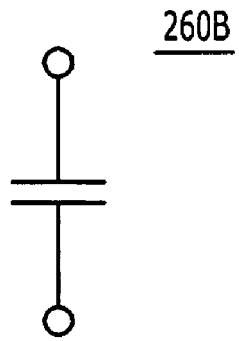

FIGS. 2A and 2B illustrate a reservoir capacitor in accordance with another embodiment of the present invention. As shown in FIG. 2A, the reservoir capacitor 260A includes two capacitors 260AA and 260AB coupled in series. As shown in FIG. 2B, the reservoir capacitor 260B may be a single large capacitor.

Figure 3:
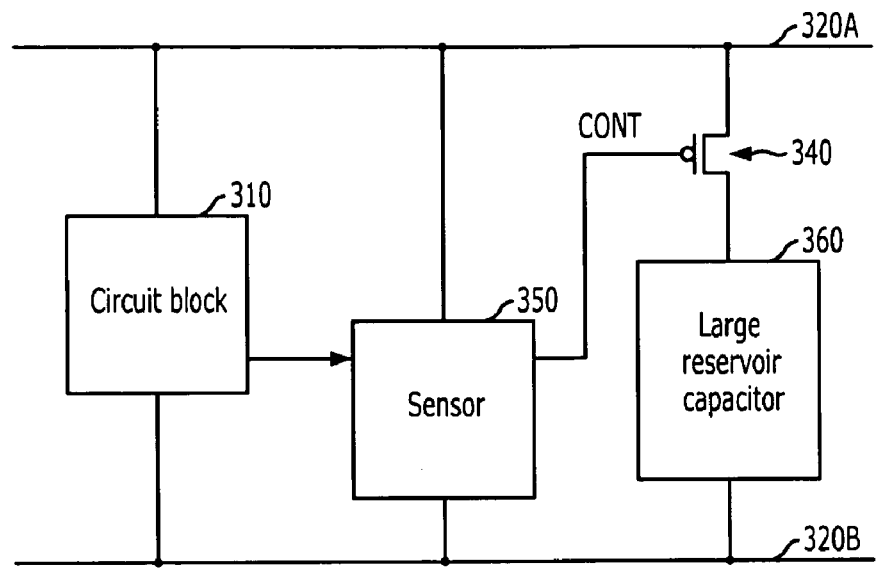
FIG. 3 is a diagram illustrating an integrated circuit having a power distributor in accordance with an embodiment of the present invention.

FIG. 3 illustrates an integrated circuit having a power distributor in accordance with another embodiment of the present invention.

Referring to FIG. 3, the integrated circuit in accordance with an embodiment of the present invention includes a circuit block 310, a sensor 350, a switching unit 340 and a large reservoir capacitor 360.

The circuit block 310 receives a power supply voltage from first and second power supply lines 320A and 320B. The first power supply line 320A includes a power supply voltage VDD and the second power supply line 320B includes a ground voltage VSS.

The sensor 350 detects an operation state of the circuit block 310, and outputs a control signal CONT as the detection result. That is, a logical value of a control signal CONT outputted from the sensor 350 is determined based on an enable state or a disable state of the circuit block 310.

The switching unit 340 controls an electrical connection between the reservoir capacitor 360 and the first power supply line 320A in response to the logical value of the control signal CONT.

The switching unit 340 is configured with a PMOS transistor coupled between the first power supply line 320A and the reservoir capacitor 360. However, the present invention is not limited thereto. The switching unit 340 may be configured with an NMOS transistor coupled between the second power supply line 320B and the large reservoir capacitor 360. Or, the switching unit 340 may include both of a PMOS transistor and an NMOS transistor.

Figure 4:
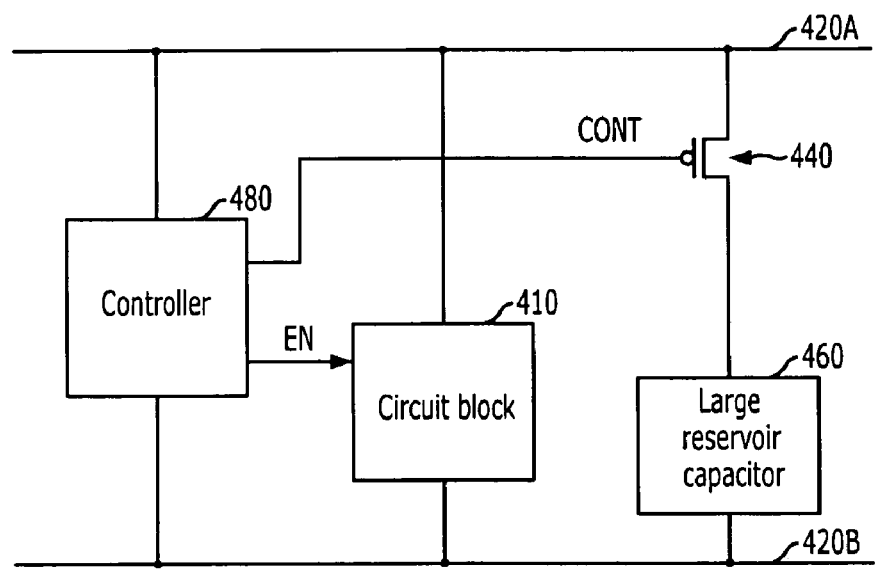
FIG. 4 is a diagram illustrating an integrated circuit having a power distributor in accordance with another embodiment of the present invention.

Unlike the integrated circuit of FIG. 3, the integrated circuit shown in FIG. 4 includes a circuit block 410, a switching unit 440 and a controller 480.

The circuit block 410 receives a power supply voltage from first and second power supply lines 420A and 420B. The first power supply line 420A includes a power supply voltage VDD and the second power supply line 420B includes a ground voltage VSS.

The switching unit 440 controls an electrical connection between the reservoir capacitor 460 and the first power supply line 420A in response to a control signal CONT.

The controller 480 controls the switching block 440 and the circuit block 410. In general, a time of operating a predetermined circuit block 410 may be controlled by a predetermined control circuit. That is, in the integrated circuit of FIG. 4, the switching unit 440 is turned on in response to the activated control signal CONT outputted from the controller 480 only when the circuit block is enabled in response to an enable signal EN outputted from the controller 480.

Referring to FIGS. 3 and 4, the circuit blocks 310 and 410 are each a block generating a low frequency noise or a block consuming power from a power supply voltage 100 times greater than power consumed by a leakage current of the reservoir capacitor 460 when the circuit blocks 310 and 410 are enabled. In this case, the switching units 340 and 440 are enabled when the circuit blocks 310 and 410 are enabled. On the contrary, the switching units 340 and 440 are disabled when the circuit blocks 310 and 410 are disabled.

In the embodiments shown in FIGS. 3 and 4, the large capacity reservoir capacitors 360 and 460 substantially have the same structure of the large capacity reservoir capacitors 160, 260A, and 260B which are shown in FIGS. 1, 2A, and 2B.

Figure 5:
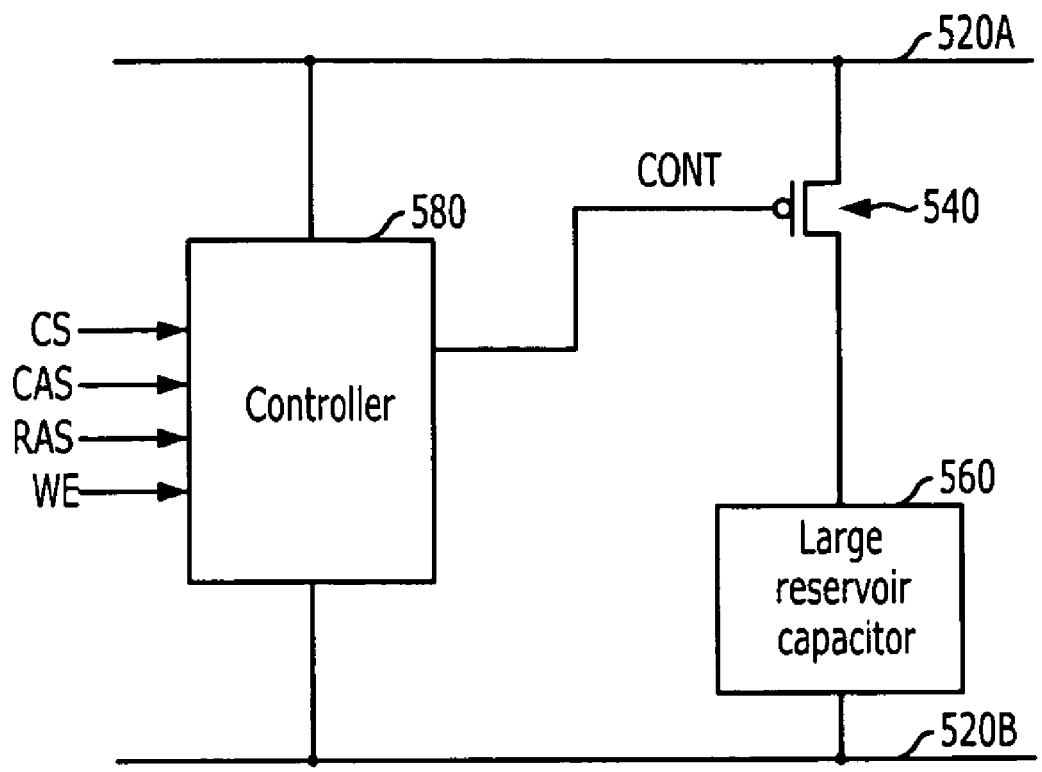
FIG. 5 is a circuit diagram illustrating a memory device having a power distributor in accordance with an embodiment of the present invention.

FIG. 5 is a circuit diagram illustrating a semiconductor device having a power distributor in accordance with another embodiment of the present invention.

Referring to FIG. 5, the semiconductor device in accordance with another embodiment of the present invention includes a large reservoir capacitor 560, a switching unit 540 and a controller 580. The switching unit 540 switches an electric connection between the large reservoir capacitor 560 and first and second power supply lines 520A and 520B. The controller 580 receives external instruction commands CS, CAS, RAS, and WE and turns on or off the switching unit based on a memory operation mode.

For example, a memory device including a DRAM has a plurality of operation modes. Among the operation modes, the reservoir capacitor may be coupled to the power supply line in an operation mode that may consumes power at least 100 times greater than power consumed by leakage current of the reservoir capacitor. On the contrary, the reservoir capacitor may be disconnected from the power supply line in operation modes consuming less power. The memory operation modes that consume less power are, for example, a power-down mode, a stand-by mode, and a refresh mode.

The memory operation mode is determined by the combination of the external instruction commands inputted to a memory chip. Therefore, a logical value of a control signal CONT is determined by the combination of instructions, and the switching unit 540 receives the control signal and is controlled by the determined logical value of the control signal CONT, thereby determining whether the large capacity capacitor 560 is used or not.

Since the power supply lines 520A and 520B, the switching unit 540, and the reservoir capacitor 560 of the memory device in accordance with another embodiment of the present invention have the same structure of those in the above described embodiments, detail description thereof is omitted.

As described above, a large capacity reservoir capacitor having μF level capacitance may be used to remove low frequency noise. Such large capacity reservoir capacitor may be implemented as a stack capacitor formed by sequentially stacking a lower electrode conductive layer, a dielectric, and an upper electrode conductive layer. The dielectric must be thin in order to increase capacitance within a limited area. Therefore, the large capacity capacitor may have large leakage current.

Therefore, in the power distributor and the integrated circuit having the same in accordance with the present invention, the leakage current of the large capacity reservoir capacitor may be blocked by controlling the electric connection between the power supply line and the large capacity reservoir capacitor.

That is, if a circuit block receiving a power supply voltage from the power supply line is a block having a low frequency noise, the large capacity reservoir capacitor may be electrically connected to the power supply line when the circuit block is enabled. On the contrary, when the circuit block is disabled, the large capacity reservoir capacitor may be disconnected from the power supply line. Also, if the circuit block consumes power at least 100 times greater than power consumed by leakage current of the reservoir capacitor when the circuit block is enabled, the reservoir capacitor may be electrically connected to the power supply line because the leakage current of the reservoir capacitor may become small enough to be ignored when the circuit block is enabled. On the contrary, when the circuit block is disabled, the reservoir capacitor may be disconnected from the power supply line because the leakage current of the reservoir capacitor may become significant.

A semiconductor device including DRAM has a plurality of operation modes. The semiconductor device having the power distributor in accordance with an embodiment of the present invention may connect the reservoir capacitor to the power supply line in an operation mode that consumes power 100 times greater than that of any other operation modes. On the contrary, if an operation mode requires less power consumption, the reservoir capacitor may be disconnected from the power supply line. Therefore, it is possible to prevent the leakage current by applying the power distributor using the reservoir capacitor according to the present invention to the memory.

While the present invention has been described with respect to the specific embodiments, it will be apparent to those skilled in the art that various changes and modifications may be made without departing from the spirit and scope of the invention as defined in the following claims.

What is claimed is:

1. A power distributor, comprising:
    a large reservoir capacitor;
    a switching unit connected between at least one power supply line and the large reservoir capacitor; and
    a controller configured to turn on or off the switching unit based on an operation state of a circuit block connected to the power supply line.

2. The power distributor of claim 1, wherein the at least one power supply line includes a first power supply line and a second power supply line, and the switching unit is coupled between the large reservoir capacitor and at least one of the first power supply line and the second power supply line.

3. The power distributor of claim 2, wherein the large reservoir capacitor includes two capacitors coupled in series.

4. The power distributor of claim 2, wherein the large reservoir capacitor includes:
    a first capacitor group having a plurality of capacitors coupled in parallel; and
    a second capacitor group having a plurality of capacitors coupled in parallel, wherein the first capacitor group and the second capacitor group are coupled in series.

5. The power distributor of claim 3, wherein the capacitor is a stack capacitor formed by sequentially stacking a lower electrode conductive layer, a dielectric layer, and an upper electrode conductive layer.

6. The power distributor of claim 1, wherein the large reservoir capacitor has a μF level capacitance.

7. The power distributor of claim 1, wherein the circuit block is configured to generate a low frequency noise when the circuit block is enabled.

8. The power distributor of claim 1, wherein the large reservoir capacitor has leakage current, and the circuit block is configured to consume power from the power supply line that is at least 100 times greater than power consumed by the leakage current when the circuit block is enabled.

9. The power distributor of claim 7, wherein the switching unit is configured to be turned on when the circuit block is enabled, and the switching unit is configured to be turned off when the circuit block is disabled.

10. An integrated circuit, comprising:
a large reservoir capacitor;
a circuit block configured to be driven with a power supply voltage provided from at least one power supply line; and
a switching unit configured to receive information about whether the circuit block is enabled or disabled and to control an electrical connection between the large reservoir capacitor and the power supply line in response to the received information.

11. The integrated circuit of claim 10, further comprising: a sensor configured to determine whether the circuit block is enabled or not and to turn on or off the switching unit.

12. The integrated circuit of claim 10, further comprising: a controller configured to control the circuit block and the switching unit.

13. The integrated circuit of claim 10, wherein the circuit block is configured to generate low frequency noise when the circuit block is enabled.

14. The integrated circuit of claim 10, wherein the large reservoir capacitor has leakage current and the circuit block is configured to consume power at least 100 times greater than power consumed by the leakage current when the circuit block is enabled.

15. The integrated circuit of claim 13, wherein the switching unit is configured to be turned on when the circuit block is enabled, and the switching unit is configured to be turned off when the circuit block is disabled.

16. The integrated circuit of claim 10, wherein the at least one power supply line includes a first power supply line and a second power supply line, and the switching unit is coupled between the large reservoir capacitor and at least one the first power supply line and the second power supply line.

17. The integrated circuit of claim 16, wherein the large reservoir capacitor includes two capacitors connected in series.

18. The integrated circuit of claim 16, wherein the large reservoir capacitor includes:
a first capacitor group having a plurality of capacitors connected in parallel; and
a second capacitor group having a plurality of capacitors connected in parallel,
wherein the first capacitor group is coupled to the second capacitor group in series.

19. The integrated circuit of claim 17, wherein the capacitor is a stack capacitor formed by sequentially stacking a lower electrode conductive layer, a dielectric layer, and an upper electrode conductive layer.

20. The integrated circuit of claim 10, wherein the large reservoir capacitor has a μF level capacitance.

21. A semiconductor device comprising:
a large reservoir capacitor;
a switching unit configured to control an electrical connection between the large reservoir capacitor and at least one power supply line in response to a control signal; and
a controller configured to receive external instruction commands and to output the control signal to turn on or off the switching unit based on an operation mode of the semiconductor device.

22. The semiconductor device of claim 21, wherein the large reservoir capacitor has leakage current, and the switching unit is configured to be turned on at an operation mode that consumes power at least 100 times greater than power consumed by the leakage current.

23. The semiconductor device of claim 21, wherein the switching unit is configured to be turned off at one of a power-down mode, a stand-by mode, and a refresh mode.

24. The semiconductor device of claim 21, wherein the power supply line includes a first power supply line and a second power supply line, and the switching unit is coupled at least one between the first power supply line and the large reservoir capacitor and between the second power supply line and the large reservoir capacitor.

25. The semiconductor device of claim 24, wherein the large reservoir capacitor includes at least two capacitors connected in series.

26. The semiconductor device of claim 24, wherein the large reservoir capacitor includes:
a first capacitor group having a plurality of capacitors coupled in parallel; and
a second capacitor group having a plurality of capacitors coupled in parallel,
wherein the first capacitor group is coupled with the second capacitor group in series.

27. The semiconductor device of claim 25, wherein the capacitor is a stack capacitor formed by sequentially stacking a lower electrode conductive layer, a dielectric layer, and an upper electrode conductive layer.

28. The semiconductor device of claim 21, wherein the large reservoir capacitor has a μF level capacitance.

* * * * *